United States Patent
Lauchner et al.

(10) Patent No.: US 6,736,277 B2
(45) Date of Patent: *May 18, 2004

(54) ADJUSTABLE RACKMOUNT ASSEMBLY

(75) Inventors: Craig Edward Lauchner, Mountain View, CA (US); Joseph W. Kaminski, Campbell, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 10/444,437

(22) Filed: May 23, 2003

(65) Prior Publication Data

US 2003/0205539 A1 Nov. 6, 2003

Related U.S. Application Data

(63) Continuation of application No. 10/094,860, filed on Mar. 11, 2002, now Pat. No. 6,615,992.

(51) Int. Cl.[7] .............................................. A47B 88/12
(52) U.S. Cl. ....................... 211/26; 211/175; 312/223.2
(58) Field of Search ................ 211/26, 175; 312/334.4, 312/334.5, 334.7, 223.1, 223.2, 265.4; 361/683

(56) References Cited

U.S. PATENT DOCUMENTS

| | | | | |
|---|---|---|---|---|
| 5,833,337 A | * | 11/1998 | Kofstad | 312/334.5 |
| 6,230,903 B1 | * | 5/2001 | Abbott | 211/26 |
| 6,373,707 B1 | * | 4/2002 | Hutchins | 211/41.17 |
| 6,431,668 B1 | * | 8/2002 | Reddicliffe | 312/334.5 |
| 6,578,939 B1 | * | 6/2003 | Mayer | 312/334.5 |
| 6,601,933 B1 | * | 8/2003 | Greenwald | 312/334.46 |
| 6,615,992 B1 | * | 9/2003 | Lauchner et al. | 211/26 |
| 2002/0158556 A1 | * | 10/2002 | Cheng | 211/26 |
| 2003/0019824 A1 | * | 1/2003 | Gray | 211/26 |
| 2003/0106863 A1 | * | 6/2003 | Lauchner et al. | 211/26 |
| 2003/0141264 A1 | * | 7/2003 | Kaminski | 211/26 |

* cited by examiner

Primary Examiner—Daniel P. Stodola
Assistant Examiner—Erica B Harris

(57) ABSTRACT

An adjustable rack mount assembly for a computer rack includes a support member, a bracket positionable beside the support member for supporting one end of the support member in the rack, a pin configured to extend from the support member through a slot in the bracket for positioning the support member relative to the bracket, and a spring clip engageable with an end of the pin for retaining the pin in the bracket.

9 Claims, 3 Drawing Sheets

ADJUSTABLE RACKMOUNT ASSEMBLY

CROSS REFERENCE TO RELATED APPLICATION(S)

This is a continuation of application Ser. No. 10/094,860 filed on Mar. 11, 2002, now U.S. Pat. No. 6,615,992, which is hereby incorporated by reference herein.

TECHNICAL FIELD

The subject matter disclosed here generally relates to racks, and more particularly, to an adjustable rackmount assembly for a computer rack.

BACKGROUND

A "rack" is a frame or cabinet for holding other equipment, such as servers and/or other computer components. Most computer racks are between 24 and 42 "rack units" in height, with each rack unit being 1.75 inches. A standard rack is 19 inches wide; however, wider racks are also available. For example, Hewlett-Packard Company, of Palo Alto, Calif., offers various "NetServer" rack configurations including its line of "System/E" and "System/U" products. Each of these products has a width of approximately 23.5 inches and a depth of 36.5 inches. However, other commonly-used racks have different depths.

Various "rackmount kits" are also available from Hewlett-Packard in order to provide support members (including, but not limited to, racks and slides) for mounting various components inside its NetServer racks. For example, U.S. Pat. No. 6,021,909 to Tang et al. (and assigned at issuance to Hewlett-Packard Company) discloses a rail system for use in an equipment enclosure and is incorporated by reference in here. Similarly, U.S. Pat. No. 6,230,903 to Abbot (also assigned at issuance to Hewlett-Packard Company) discloses a rack support rail system and is also incorporated by reference here. However, these conventional rackmount assemblies are limited to 36.5 inch deep rack configurations and can not be easily, or safely, used with racks having other depth dimensions.

SUMMARY

These and other drawbacks of conventional technology are addressed here by providing an adjustable rackmount assembly including a support member; a bracket positionable beside the support member for supporting one end of the support member in the rack; a pin configured to extend from the support member and through the bracket for positioning the support member relative to the bracket; and a spring fastener, engageable with an end of the pin, for retaining the pin in the bracket.

Also disclosed is an adjustable rackmount assembly including a support member; first means positionable beside the support member for supporting one end of the support member in the rack; second means configured to extend from the support means and through the first means for positioning the support member relative to the bracket; and means for clipping to an end of the second means and retaining the second means in the first means.

In another embodiment, the technology disclosed here relates to a rack including a base; a plurality of columns extending from the base; and a support member, having a plurality of holes, extending between two of the columns. A bracket is positioned beside the support member for securing one end of the support member to one of the two columns. The bracket has a plurality of slots arranged end-to-end and separated by a distance between adjacent ends of the each slot. A mounting pin assembly, having at least two pins extending from one side of a yoke, is arranged so that each pin extends through a hole in the support member and through a slot in the bracket for positioning the support member relative to the bracket. A spring clip is then engaged with the pins for retaining the pins in the bracket and support member.

BRIEF DESCRIPTION OF THE DRAWINGS

Various aspects of the invention will now be described with reference to the following figures ("FIGS.") which are not necessarily drawn to scale, but use the same reference numerals to designate corresponding parts throughout each of the several views.

DETAILED DESCRIPTION OF THE PREFERRED EMBODIMENTS

Figure 1:
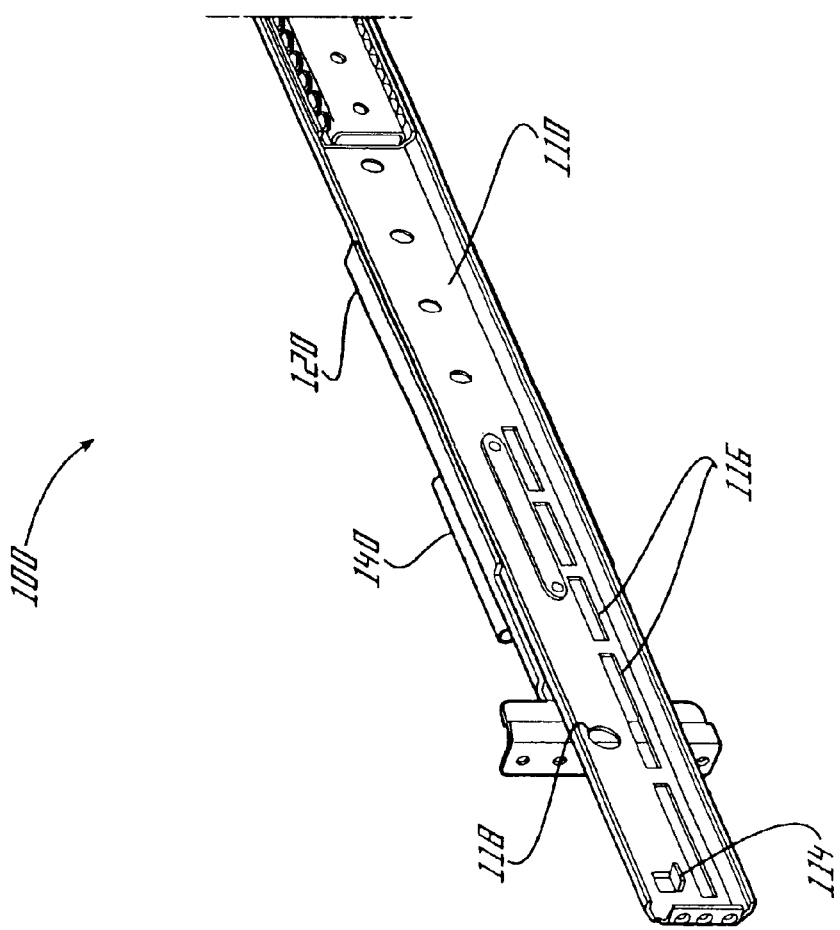
FIG. 1 is an assembled isometric view of one embodiment of an adjustable rackmount assembly.
Figure 2:
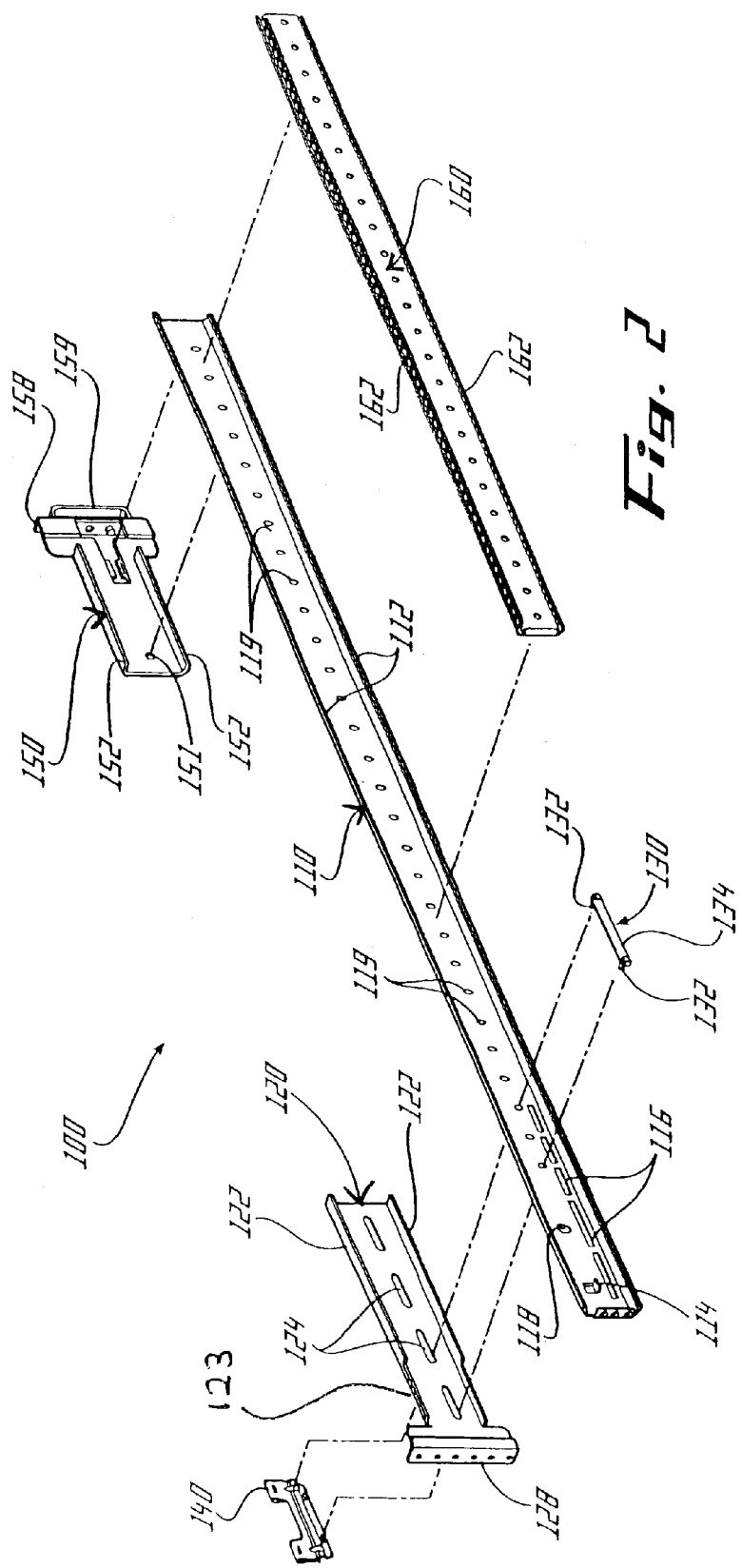
FIG. 2 is an exploded isometric view of the adjustable rackmount assembly shown in FIG. 1.
Figure 7:
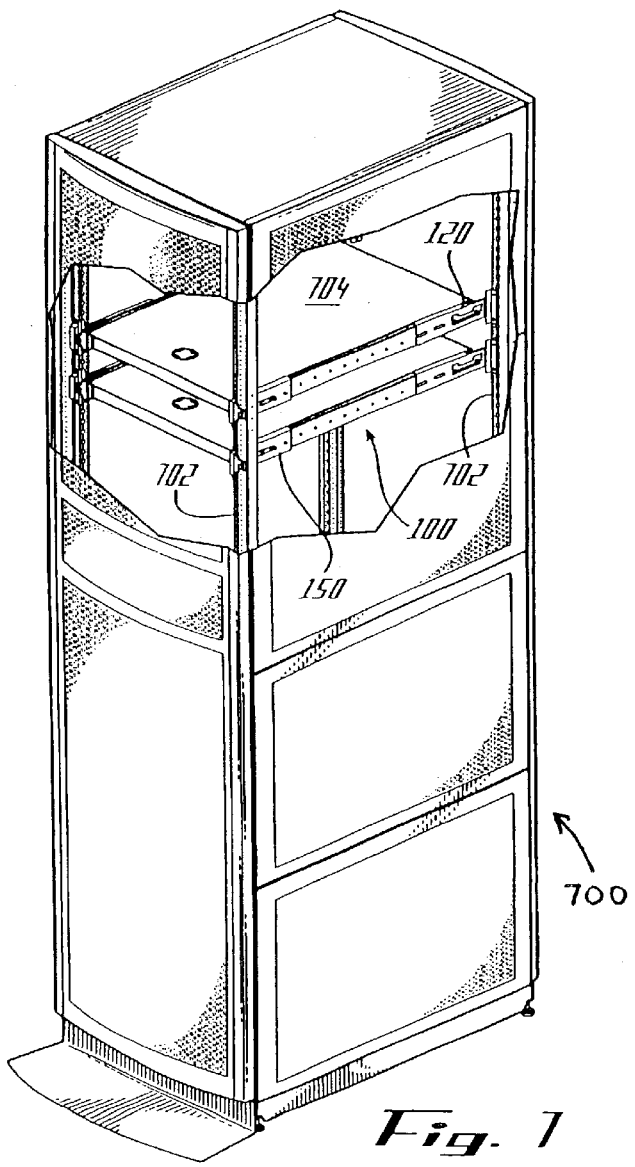
FIG. 7 is an isometric view of a rack including the rackmount assembly shown in FIGS. 1 and 2.

FIGS. 1 and 2 illustrate one embodiment of a continuously adjustable rackmount assembly 100. The term "assembly" is used here to describe a group of assembled or unassembled component parts, such as those shown in FIG. 2, that are configurable into a device, such as the one shown in FIG. 1. This term also refers to a process for configuring the parts into the assembled device that is generally referred to as a "rackmount" because it can be mounted in a "rack" frame or cabinet for holding other equipment, such as computer equipment. An example of one such rack 700 is illustrated in FIG. 7. As described in more detail below, the length of the rackmount assembly 100 is continuously, rather than incrementally, adjustable for use with racks having any depth.

As shown in the assembled and unassembled views in FIGS. 1 and 2, respectively, the rackmount assembly 100 includes a support (slide) member 110, rear bracket 120, mounting pin assembly 130, and retaining clip 140. An optional front bracket 150 may also be provided for securing the rackmount assembly 100 in the rack 700 shown in FIG. 7. However, the front bracket 120 may be formed as an integral part of the support member 110, or the front bracket 150 may be directly fastened, joined, or otherwise secured to the rack 700. An optional roller member 160 provides for sliding movement in connection with various drawers, trays, shelves, and/or other supports (not shown in FIGS. 1 and 2). Although the illustrated roller member 160 includes rollers 162 on its top and bottom edge for contacting the support member 110, the roller member may also be provided without rollers 162 so that it makes direct sliding contact with the support member 110.

The illustrated slide-type support member 110 is provided with top and bottom shoulders 112 for abutting rollers 162 on the roller member 160. However, the support member 110 may also be in the form of a rail-type and/or non-sliding support member (not shown) that does not receive the rollers 162 and/or does not provide for rolling or sliding of any such supported member 160. Such rail-type support members may have just one, or none, of the top and bottom shoulders 112. The illustrated slide-type support member 110 is also be provided with an optional tab 114 for abutting against the end of the roller member 160 when the roller member slides to one end of the support member.

The support member 110 is also provided with various holes for receiving other structures and/or reducing the weight of the support member 110. For example, [optional rectangular slots 116 and] optional circular hole 118 may be used for securing various structures that are not shown in the FIGS. to the support member 110. The mounting holes 119, on the other hand, may be used for securing the support member 110 to the rear bracket 120 and/or optional front bracket 150. For example, a bolt, screw, rivet, pin, clip and/or other fastener (not shown) will extend through the hole 151 and the corresponding mounting hole 119 in the support member 110 for securing the support member to the front bracket 150. Alternatively, or in addition, the support member 110 may be secured to the front bracket 150 by other conventional fastening and/or joining processes.

The front bracket 150 is provided with shoulders 152 for engaging the outer surfaces of the corresponding shoulders 112 on the support member 110. If the support member 110 is not provided with shoulders 112, then the shoulders 152 on the front bracket may be arranged to abut edges of the support member 110. The front bracket 150 is also provided with a flange 158 for securing the front bracket to a vertical column 702 in the rack 700 (FIG. 7) with a bolt, screw, rivet, pin, clip and/or other fastener (not shown). A handle 159 is provided for attaching a computer component (not shown) to the rackmount assembly 100.

As with the front bracket 150, the rear bracket 120 includes a flange 128 for securing the rear bracket 120 to vertical columns 702 in the rack 700 (FIG.7). The rear bracket 120 may be alternatively be hooked on the rack 700 and/or secured to the rack using other conventional fastening and/or joining technologies. The rear bracket is similarly provided with shoulders 122 for engaging the outer surfaces of the corresponding shoulders 112 on the support member 110. However, in the illustrated configuration, the shoulders 122 do not extend along the entire length of rear bracket 120. A gap 123 is provided in the rear bracket shoulder 122 for allowing a small amount of [rotation] clearance between the support member 110 and rear bracket 120 for a cable manager term (not shown). The rear bracket 120 may also be provided without the shoulders 122 and/or without the gap 123.

The rear bracket 120 is positioned beside the support member 110 for supporting the rear end of the support member 110 in the rack 700 (FIG. 7) wherein the rear end of the support member may extend past the rear side of the rack. The position of front and rear brackets 150, 120 relative to the rack 700 may also be reversed. The position of tile rear bracket 120 relative to the slide member 110 is continuously adjustable to match the depth of the rack 700 (FIG. 7) using, for example, the mounting pin assembly 130 and spring clip 140 as described in more detail below.

Figure 6:
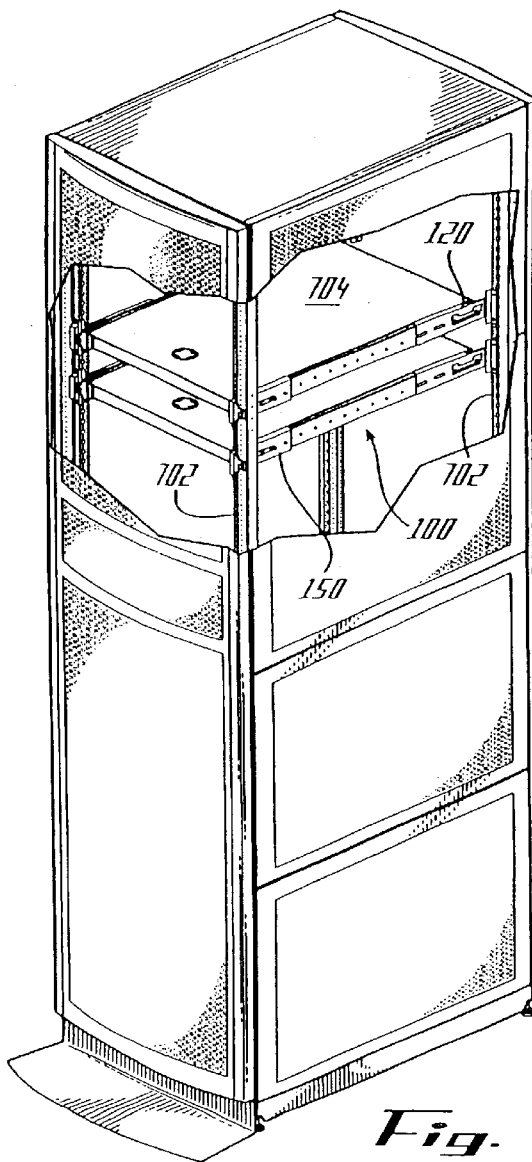
FIG. 6 is a side view of the mounting pin assembly shown in FIGS. 1 and 2.

The mounting pin assembly 130 that is illustrated in FIGS. 1, 2, and 6 includes two pins 132 that extend from a yoke 134. However, fewer or more pins may be used with a longer or shorter yoke, and/or without the yoke 134. The yoke 134 aids in supporting and positioning the pins 132 over the holes 119 in the support member 110 during assembly. The pins 132 preferably have a cylindrical shape corresponding to the shape of the holes 119. However, the pins 132 and/or holes 119 may also be other shapes including, but not limited to square, rectangular, and octagonal.

During assembly, the pin(s) 132 are inserted through the holes 119 and through the corresponding slots 124 in the rear bracket 120 that are aligned with the hole 119 when the bracket 120 is in position. The pins 132 (along with any shoulders 122) help prevent the support member 110 from moving vertically with respect to the rear bracket 120. However, depending upon the position of the pins 132 in the slots 124, the pins (and support member 110) may be allowed to slide horizontally along the length of the slots 124. The pins 132 therefore position the support member 110 relative to the rear bracket 120 so that the rear end of the support member is adjustable relative to the rear bracket.

The distance between the pins 132 is referred to as the "pitch." This pitch distance is preferably twice the distance between holes 119 and twice the distance between adjacent ends of the slots 124. In this configuration, position of the rear bracket 120 is continuously adjustable to any location along the length of the support member 110. These relative dimensions allow the rackmount assembly 100 to be used with racks 700 (FIG. 7) having a wide range of depths. For example, the rackmount assembly 100 may be easily configured to work with shallower racks (having a shorter dimension from front to back) than the rack 700 shown in FIG. 7. The slots 124 may also be joined together into one or more longer slot(s).

The mounting pin assembly 130 is retained in the rear bracket 120 by a suitable spring fastener such as the spring clip 140 illustrated in FIGS. 1–5. Details of the mounting pin assembly 130 and the spring clip 140 are best shown in FIGS. 3–6 referred to below. As illustrated in FIG. 6, the pins 132 are secured in holes through the yoke 134 by heads 136 or other conventional means such as bolting, screwing, riveting, clipping, and/or other fastening or joining technologies. Some, or all, of the pins 132 preferably include a groove 138 for engaging and edge of the clip 140 as described in more detail below with respect to FIGS. 3–5. However, the pins 132 may be provided without the groove 138 and/or include other fastener securing features such as a hole for receiving a Cotter pin or threads for engaging a nut.

Figure 5:
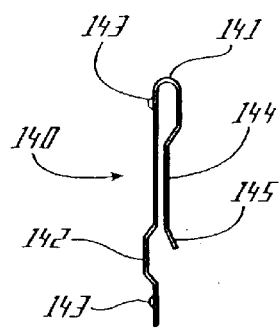
FIG. 5 is a side view of the retaining clip shown in FIGS. 3 and 4.

As shown in the profile of FIG. 5, the spring clip 140 is generally U-shaped with the two arms of the "U" extending downward in FIGS. 1–5. This shape provides a resilient hinge 141 at the top of the spring clip 140 so that the ends of the arms can be compressed together, preferably in an elastic manner. However, other types of resilient hinges may also be provided including, but not limited to, spring-assisted journal-bearing-type and door-type hinges. Although the spring clip 140 is illustrated in FIGS. 1–5 as having one arm longer than the other, the arms may also have the same, or a substantially similar, length.

The long arm of the illustrated spring clip 140 is provided with a bulge 142 and dimples 143 for abutting against the side surface of the rear bracket 120. The bulge 142 and dimples 143 preferably extend approximately the same distance from the surface of the long arm for providing stable contact with the rear bracket 120. Corresponding depressions (not shown) may also be provided in the surface of the rear bracket 120 to further aid in aligning the spring clip 140 on the surface of the bracket 120.

Figure 3:
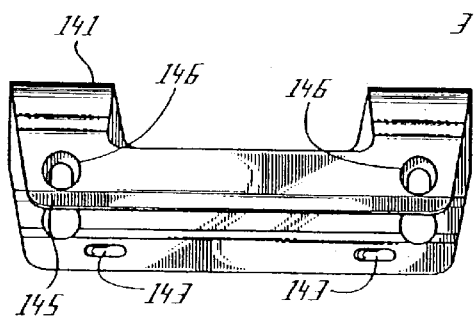
FIG. 3 is a front view of the retaining clip shown in FIGS. 1 and 2.
Figure 4:
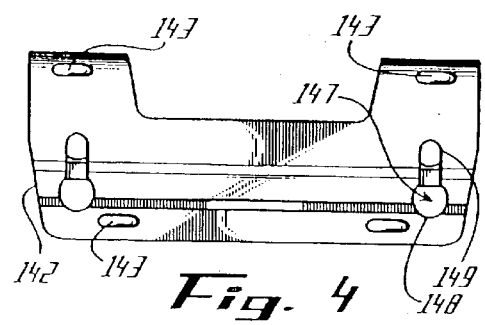
FIG. 4 is a rear view of the retaining clip shown in FIGS. 1 and 2.

The short arm (opposite the long arm) of the spring clip 140 includes a depression 144 and terminates at its free end with an optional lip 145. As best illustrated in FIG. 3, openings 146 are formed through the short arm of the spring clip 140 and separated by the distance between the pins 132 in the mounting pin assembly 130. The bottom edge of each of the openings 146 is preferably arranged near the top edge of the lip 145. Although the two circular openings corresponding the outer circumference of the two cylindrical pins 132 are illustrated in the Figures, other shapes and/or numbers of openings may also be used.

The long arm of the spring clip 140 preferably also includes one or more keyhole slots 147 having a (lower) wide portion 148 connected to a (upper, elongated) narrow portion 149. The wide portion 148 of the illustrated keyhole slots 147 is shown as being substantially circular in shape, corresponding to the outer circumference of the pins 132. However, other shapes may also be used. The wide portion 148 of one, or more, of the keyhole slots 147 is preferably arranged substantially in the bulge 142 while the narrow portion 149 of the keyhole slot preferably extends upward from the wide portion 148 past the edge of the bulge 142. The narrow portion 149 of each of the keyhole slots 147 is also aligned with corresponding openings 146 in the short arm of the spring clip 140.

As best shown in FIG. 2, during assembly of the device 100, the pins 132 of the mounting pin assembly 130 are inserted through the holes 119 in the support member 110 and the slots 124 in the rear bracket 120. The wide portion 148 of the keyhole slot 147 is then arranged over the ends of the pins 132 so that the bulge 142 and dimples 143 are adjacent to the rear bracket 120. The spring clip 142 is then moved downward so that the ends of the pins 132 engage the lip 145 and push the short arm of the spring clip 140 outward until the ends of the pins 132 snap into the openings 146 on the short arm. Upon release of the spring clip 140 (or with the aid of an assembler), the edges of the openings 146 will fall inside the grooves 138 in the pins 132. The engaged spring clip 140 will thus clip to the ends of the pins 132 and retain the pins in the rear bracket 120.

Turning now to FIG. 7, the illustrated rack 700 is provided with a base (not enumerated) and several columns 702 extending from the base. The rackmount assembly 100 is secured between two of the columns 702 with the support member 110 extending between the columns. More specifically, each of the front and rear brackets 150, 120 is secured to one of the columns 702 in the rack 700 either before, or after, the support member 110 is secured to the brackets as described above. Depending upon the depth of the rack 700, the end of the support member may extend past the rear column. Rackmount assemblies 100 on each side of the rack 700 can therefore be used to provide support for various components including, but not limited to, the trays 704 shown in FIG. 7.

As discussed above, the position of the rear bracket 120 with respect to the support member 110 is easily and continuously adjustable in infinitely small increments. The rackmount assembly 100 can be therefore he adjusted for racks 700, trays 704, drawers, rails, and/or other components having a wide variety of depths. The rackmount assembly 100 is also quick and easy to assemble and secure to the rack 700 without any tools.

It should be emphasized that the embodiments described above, and particularly any "preferred" embodiments, are merely examples of various implementations that have been set forth here to provide an understanding of various aspects of the invention. One of ordinary skill will be able to alter many of these embodiments without substantially departing from scope of protection defined solely by the proper construction of the following claims.

What is claimed is:

1. An adjustable rackmount assembly, comprising:
    a support member including a series of openings therein;
    a bracket positionable beside the support member for supporting one end of the support member in a rack;
    a mounting pin assembly having two pins extending in a same direction and properly spaced to extend through two openings in the support member and through the bracket for positioning the support member relative to the bracket; and
    a fastener, engageable with an end of each of the two pins, for retaining the mounting pin assembly in the bracket, wherein the fastener includes a spring clip for clipping to the ends of the two pins.

2. The assembly recited in claim 1 wherein the spring clip is substantially U-shaped with two holes through two arms thereof for receiving the two pins.

3. The assembly recited in claim 2 wherein the two holes of one arm comprise keyhole slots.

4. The assembly recited in claim 3 wherein the one arm includes a bulge, adjacent to a wide portion of the keyhole slot for abutting a surface of the bracket.

5. An adjustable rackmount assembly, comprising:
    a support member having a series of holes therein;
    first means, positionable beside the support member, for supporting one end of the support member in a rack;
    second means, configured with at least two connecting members extending through the support member and through the first means, for positioning the support member relative to the first means; and
    means for clipping to an end of second means and retaining the second means in the first means.

6. The assembly recited in claim 5 wherein said clipping means further comprises a substantially U-shaped spring clip with a first arm and a second arm.

7. A assembly recited in claim 6 wherein the first arm comprises
    a keyhole slot for receiving a first portion of each connecting member of the second means; and
    a bulge, adjacent to a wide portion of the keyhole slot, for abutting the first means.

8. The assembly recited in claim 7 wherein the second arm comprises
    an opening, aligned with a narrow portion of the keyhole slot, for receiving a second portion of each connecting member of the second means; and
    a lip arranged at a free end of the second arm, for guiding the second means into the opening.

9. The assembly recited in claim 8 wherein the second means further comprises a groove on the second connecting member that is engageable with a wall of the opening.

* * * * *